United States Patent
Park

(10) Patent No.: US 9,779,915 B2
(45) Date of Patent: Oct. 3, 2017

(54) PLASMA GENERATING DEVICE COMPRISING A ROTATING BODY

(71) Applicant: Applied Plasma Inc Co., Ltd., Daegu (KR)

(72) Inventor: Jae Beom Park, Daegu (KR)

(73) Assignee: APPLIED PLASMA INC CO., LTD., Daegu (KR)

( * ) Notice: Subject to any disclaimer, the term of this patent is extended or adjusted under 35 U.S.C. 154(b) by 0 days.

(21) Appl. No.: 15/103,412

(22) PCT Filed: Dec. 11, 2013

(86) PCT No.: PCT/KR2013/011461
§ 371 (c)(1),
(2) Date: Jun. 10, 2016

(87) PCT Pub. No.: WO2015/088069
PCT Pub. Date: Jun. 18, 2015

(65) Prior Publication Data
US 2016/0314938 A1    Oct. 27, 2016

(30) Foreign Application Priority Data

Dec. 11, 2013  (KR) .......................... 10-2013-0153671

(51) Int. Cl.
*H01J 37/32* (2006.01)
*C23C 8/36* (2006.01)
(Continued)

(52) U.S. Cl.
CPC .. *H01J 37/32055* (2013.01); *H01J 37/32449* (2013.01); *H01J 37/32541* (2013.01);
(Continued)

(58) Field of Classification Search
CPC   H01J 37/32; H05H 1/34; G01N 21/73; C23C 8/36
(Continued)

(56) References Cited

U.S. PATENT DOCUMENTS 6,800,336 B1 * 10/2004 Fornsel ..................... C23C 8/36
                                                            118/723 E
7,335,850 B2 *  2/2008 Kuo ......................... H05H 1/34
                                                            219/121.48
(Continued)

FOREIGN PATENT DOCUMENTS

DE    WO 2006136467 A1 * 12/2006 ............. G01N 21/73
JP          2006037204 A    2/2006
WO          2006136467 A1  12/2006

OTHER PUBLICATIONS

International Search Report for PCT/KR2013/011461 dated Sep. 11, 2014.

*Primary Examiner* — Dylan White
(74) *Attorney, Agent, or Firm* — Thompson Coburn LLP

(57) ABSTRACT

A plasma generating device is disclosed. A plasma generating device according to an embodiment of the present invention comprises: a plasma generating module for generating plasma; and at least one plasma nozzle for externally discharging the plasma generated by the plasma generating module, wherein a rotating body is provided separately from the plasma generating module and is rotatably disposed on the outside of the plasma generating module.

14 Claims, 9 Drawing Sheets

(51) Int. Cl.
*H05H 1/34* (2006.01)
*G01N 21/73* (2006.01)

(52) U.S. Cl.
CPC ......... *H01J 37/32623* (2013.01); *H05H 1/34* (2013.01); *H01J 2237/024* (2013.01); *H05H 2001/3463* (2013.01)

(58) Field of Classification Search
USPC .................................................. 315/111.21
See application file for complete search history.

(56) References Cited

U.S. PATENT DOCUMENTS

| | | | |
|---|---|---|---|
| 9,144,148 B2* | 9/2015 | Zhang | H05H 1/34 |
| 2007/0235417 A1 | 10/2007 | Kuo | |
| 2016/0024849 A1* | 1/2016 | Kocis | H05H 1/40 |
| | | | 175/16 |

* cited by examiner

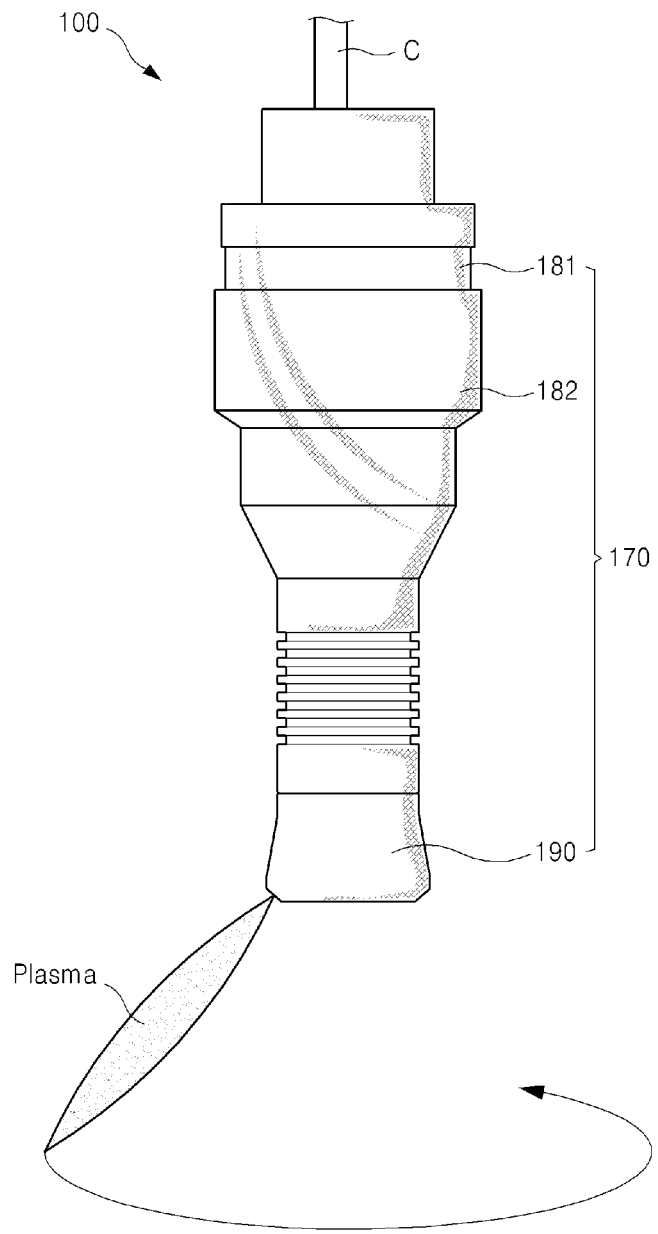
[Fig. 1]

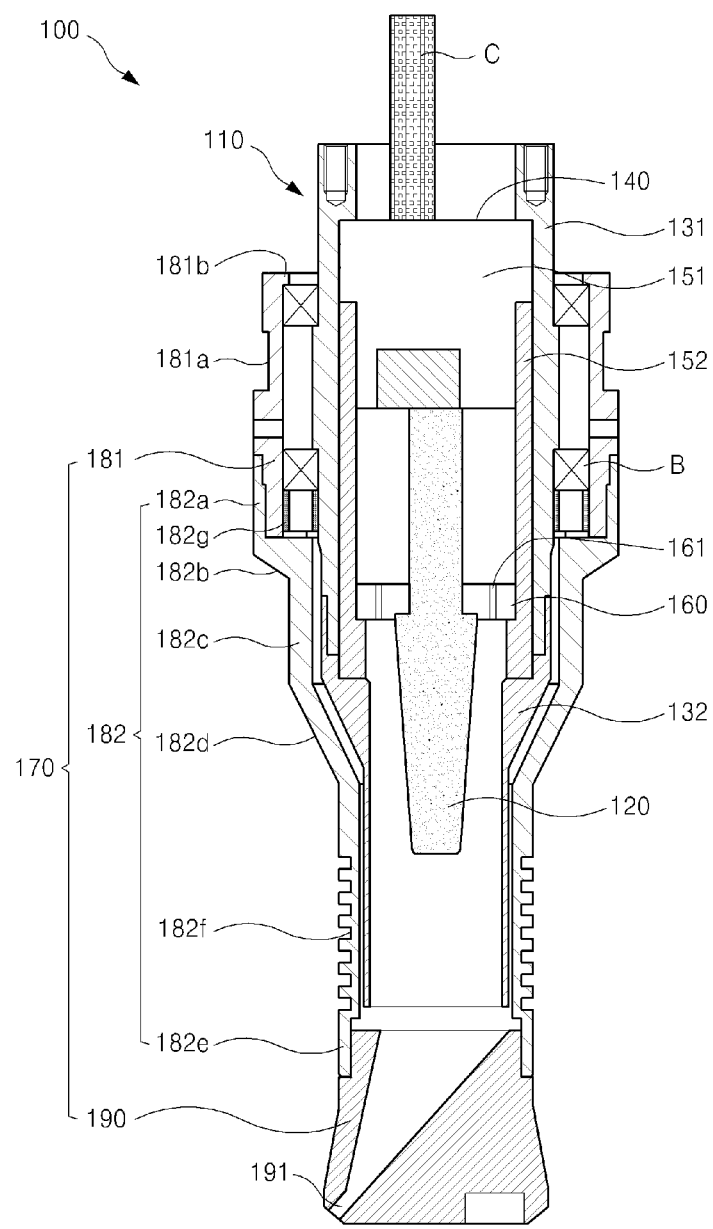
[Fig. 2]

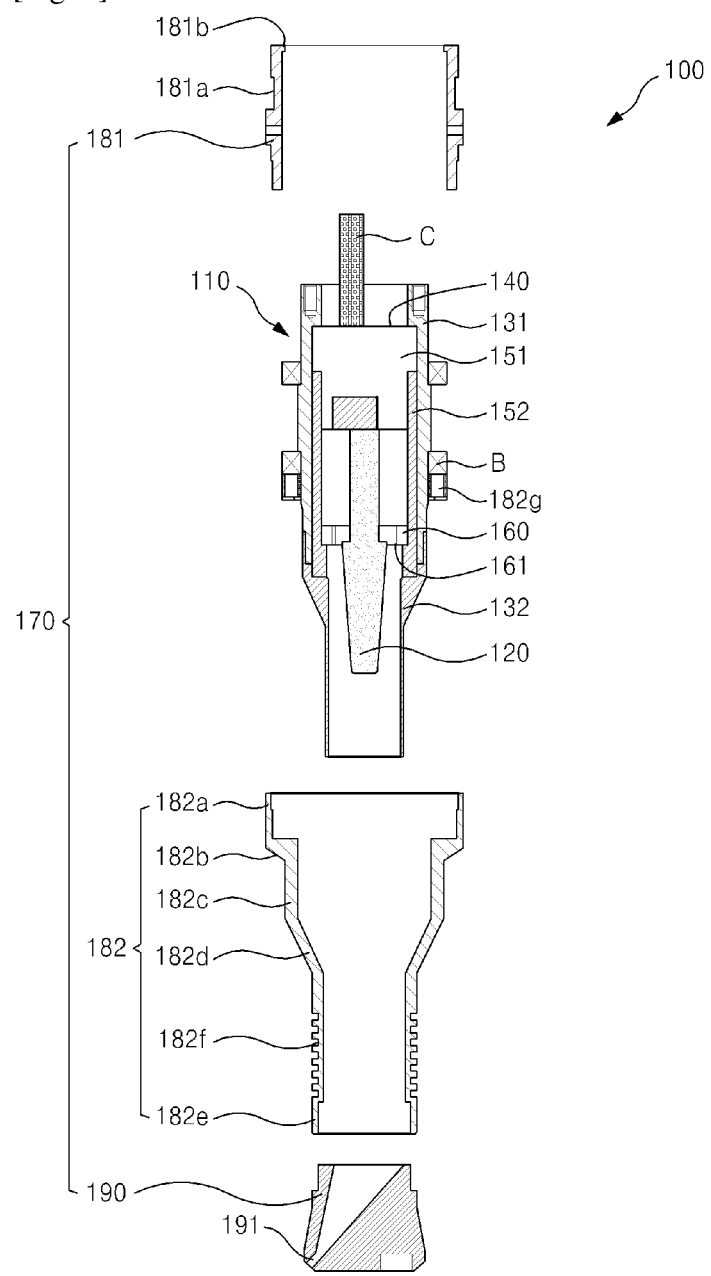

[Fig. 4]
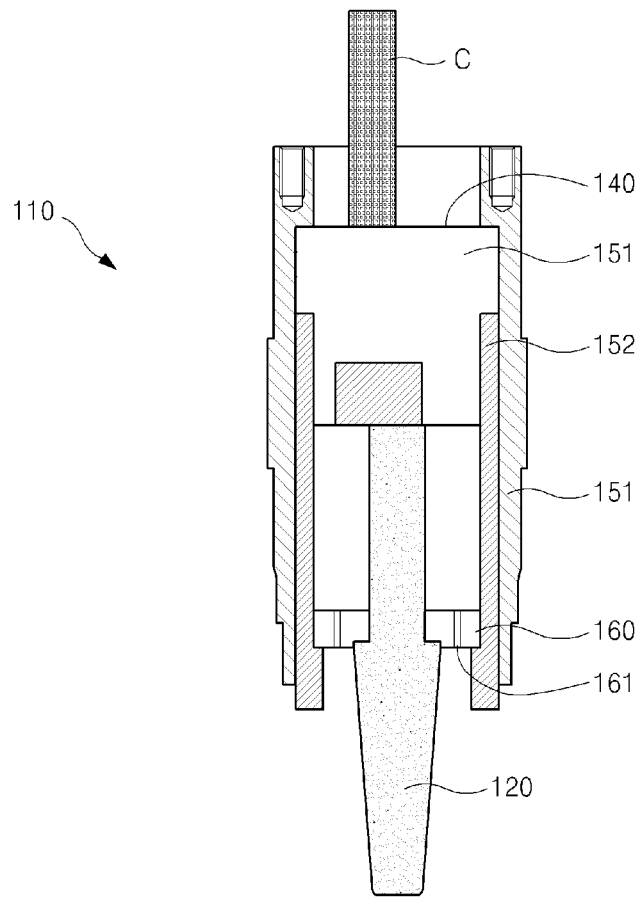
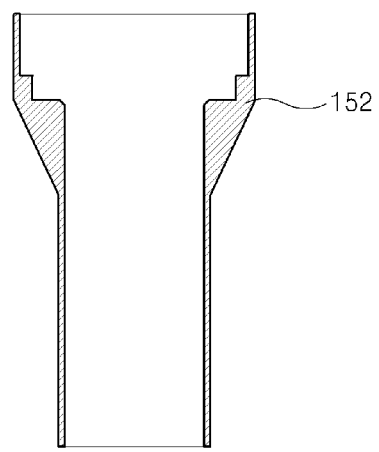

[Fig. 5]
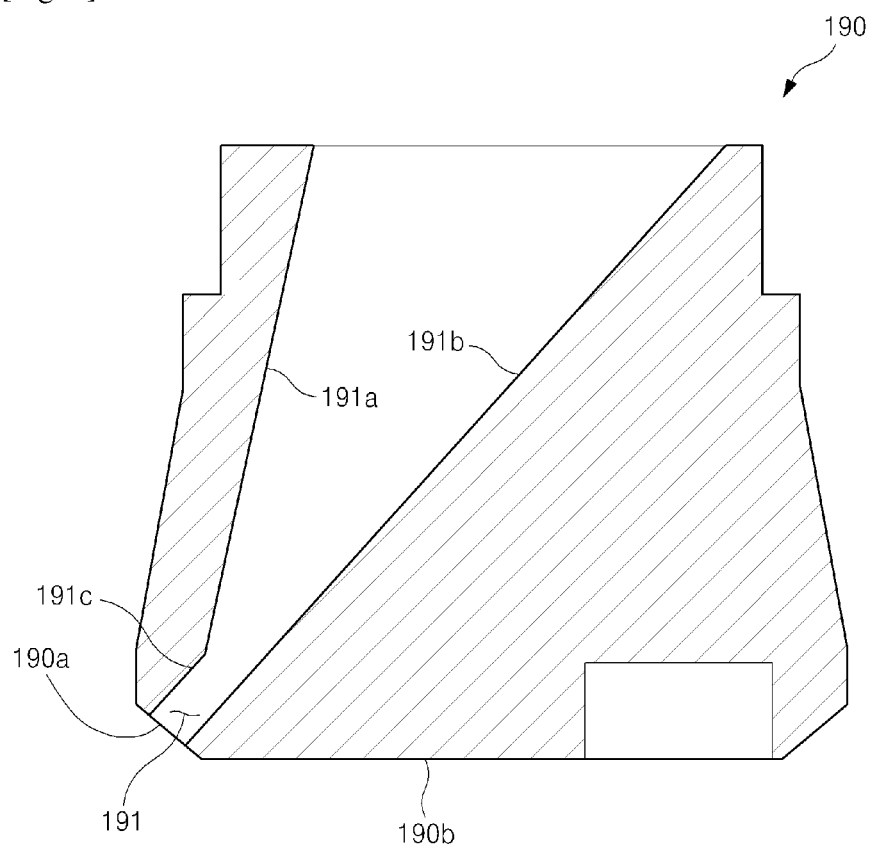

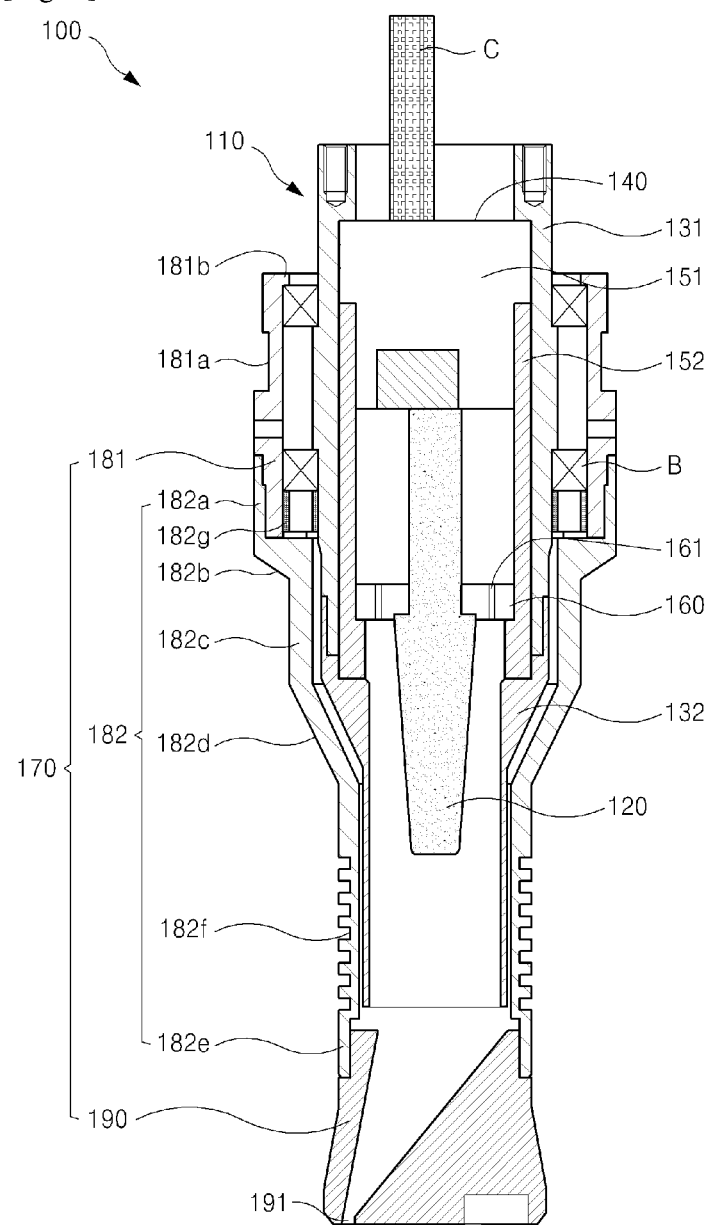
[Fig. 6]

[Fig. 7]
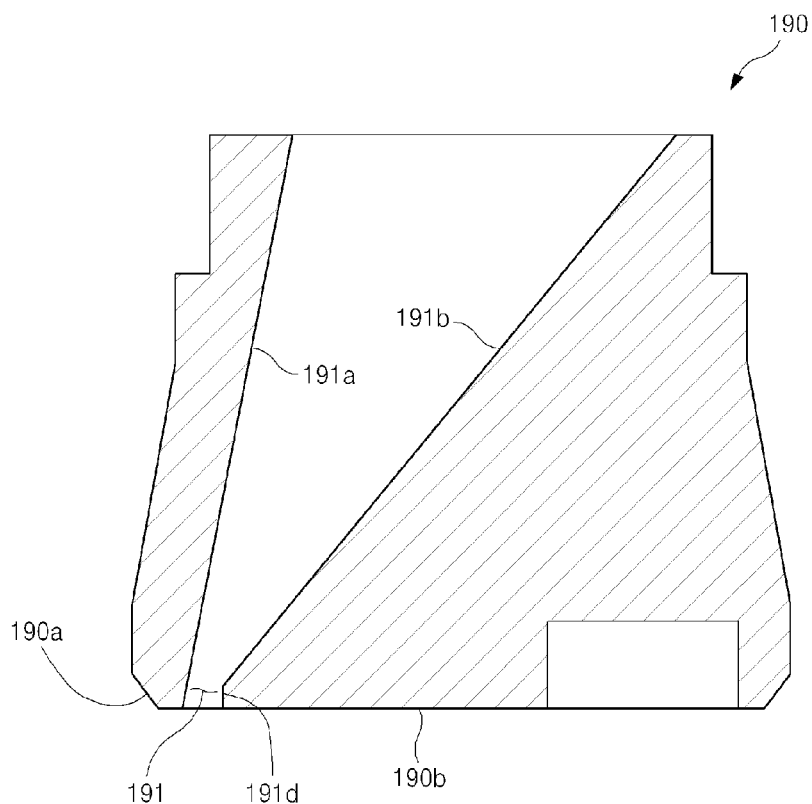
[Fig. 8]
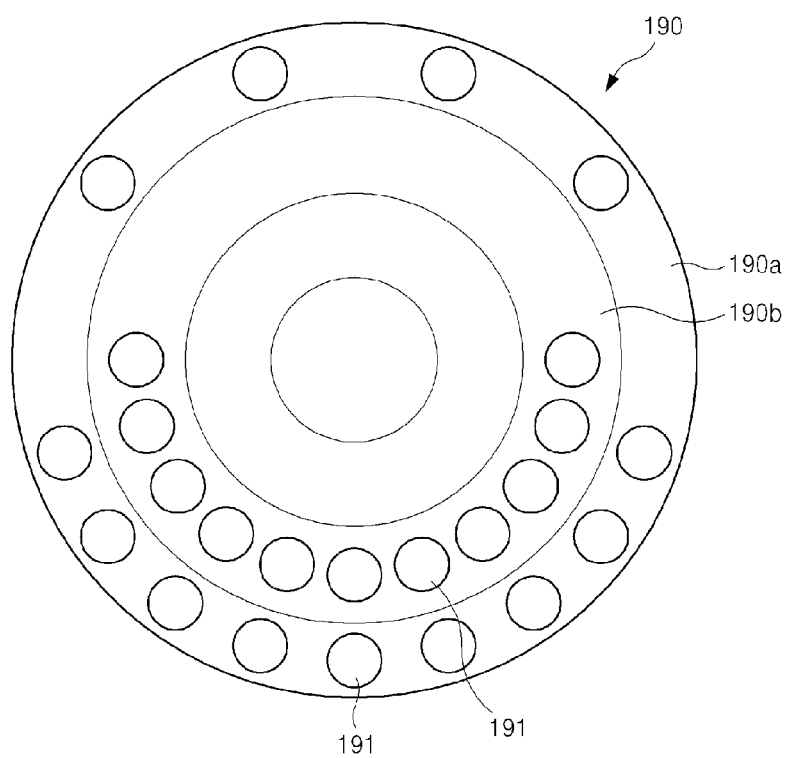

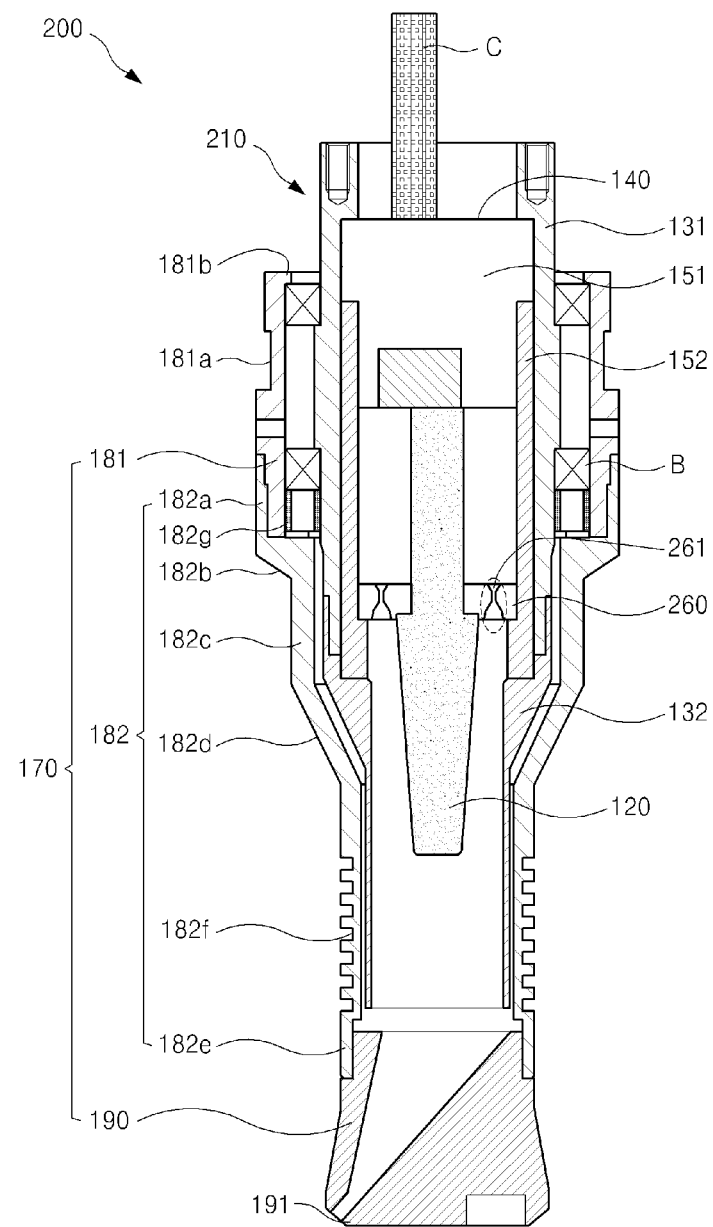
[Fig. 9]

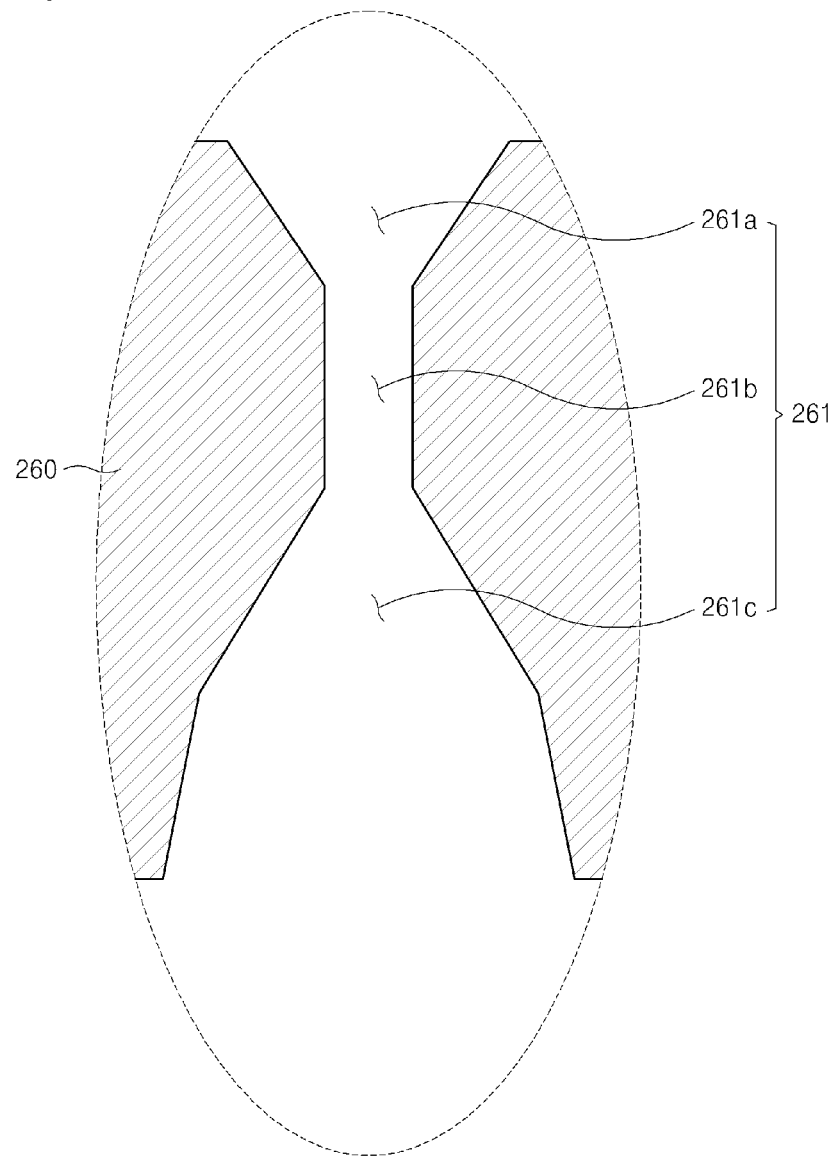
[Fig. 10]

PLASMA GENERATING DEVICE COMPRISING A ROTATING BODY

CROSS-REFERENCE TO RELATED APPLICATIONS

This application is a U.S. National Phase application of PCT/KR2013/011461, filed on Dec. 11, 2013, claiming the benefit of KR Application No. 10-2013-0153671, filed Dec. 11, 2013, both of which are incorporated herein by reference in their entireties.

TECHNICAL FIELD

The present invention relates to a plasma generating device and, more particularly, to a plasma generating device which has a compact and improved structure, unlike the conventional devices, without requiring a complex structure such as a carbon brush, etc., which makes it possible to prevent the generation of dust and foreign material from the carbon brush, avoid frequent maintenance, and significantly improve the durability of the device, and thus can be widely applied to various industrial processes that require plasma.

BACKGROUND ART

Plasma refers to the state of a gas ionized into negatively charged electrons and positively charged ions at an ultra-high temperature. In this state, the charge separation is very high, the numbers of negative and positive charges are equal, and thus the overall charge of the plasma is neutral.

Generally, the states of matter are divided into solid, liquid, and gas states. Since the state of plasma is different from the solid, liquid, and gas states, the plasma is often called the fourth state of matter.

When energy is applied to a solid, the solid becomes a liquid and then a gas, and when high energy applied again to the gas state, the gas is separated into electrons and atomic nuclei at a temperature of several tens of thousands of degrees Celsius.

In order to artificially create plasma, electrical methods such as direct current, ultra-high frequency, electric beam, etc. are required, and then this state should be maintained by a magnetic field.

To use the plasma in daily life, it should be artificially created in such a manner, but it can be said that the plasma is the most common state of matter in the universe. It has been assumed that 99% of matter in the universe is in the plasma state.

Lightning, aurora in the arctic, ionosphere in the atmosphere, etc. are in the plasma state. Outside the atmosphere, the plasma is also present in the Van Allen belt where the ions are trapped in the Earth's magnetic field and also in the solar wind coming from the sun. The interior of a star or the gas around the star is also in the plasma state. Hydrogen gas present in the space between stars is also in the plasma state.

Artificial plasmas that can be seen in everyday life include fluorescent lamps, mercury lamps, plasma display panels, etc.

Efforts to artificially create plasma and put it to practical use have been continuously made for a long time.

Plasmas are widely used, including plasma for nuclear fusion at a temperature of several hundreds of millions of degrees, low-temperature glow plasma or arc plasma used in semiconductor processes, synthesis of new materials, etc.

In particular, the low-temperature plasma is most widely studied and applied in industry. The reactivity is maximized in plasma, and thus the ionization and recombination of substances become active. Therefore, the use of plasma makes it possible to create a new substance, which is difficult to accomplish with the conventional synthesis or processing of substances, and replace the processes that cause pollution or that are difficult to perform.

Moreover, in a photolithography process, one of the manufacturing processes of flat panel display devices including liquid display devices or semiconductors, the plasma is used to remove a photoresist by ashing, which is used to pattern a metal material or semiconductor layer, to etch a thin film made of an organic material or semiconductor material, or to remove the organic material, etc. from the surface by cleaning.

As such, the plasma is widely used throughout the industry, and thus a variety of plasma generating devices for artificially generating plasma has also been commercialized.

Meanwhile, it has been reported that among the variety of plasma generating devices, some types of plasma generating devices that require carbon brushes have been applied.

In the case of this type of plasma generating device, a separate bearing is required to serve as a ground in the nature of its structure, and thus the damage to the ground bearing has been recognized as a major issue.

In practice, given that the main goal in the manufacturing process of flat panel display devices or semiconductors is to improve the productivity due to a reduction in tack time, if the maintenance of the plasma generating device occurs frequently due to damage to the ground bearing, etc., the operation of the device should be stopped during the maintenance of the plasma generating device, and thus the problem of damage to the ground bearing should not be easily overlooked. Therefore, there is a need to develop a new and advanced type of plasma generating device based on these matters.

DISCLOSURE

Technical Problem

An object of the present invention is to provide a plasma generating device which has a compact and improved structure, unlike the conventional devices, without requiring a complex structure such as a carbon brush, etc., which makes it possible to prevent the generation of dust and foreign material from the carbon brush, avoid frequent maintenance, and significantly improve the durability of the device, and thus can be widely applied to various industrial processes that require plasma.

Technical Solution

The above object is accomplished by providing a plasma generating device comprising: a plasma generating module which generates plasma; and a rotating body which is provided with at least one plasma nozzle, through which the plasma generated by the plasma generating module is blown to the outside, and is provided separately from the plasma generating module to be rotatably disposed on the outside of the plasma generating module.

The plasma generating module may comprise a high-voltage electrode which is disposed in the central area; a counter electrode which is disposed around the high-voltage electrode and charged with electric power applied to the high-voltage electrode to generate a high-voltage arc; and a gas inlet which is provided between the high-voltage electrode and the counter electrode and through which compressed air or gas is injected into a discharge head.

The plasma generating module may further comprise: at least one high-voltage insulator which is provided between the high-voltage electrode and the counter electrode; and a gas distributor which comprises a plurality of gas distribution holes through which the compressed air or gas is distributed.

The high-voltage insulator may comprise: a first high-voltage insulator which is disposed adjacent to the gas inlet; and a second high-voltage insulator which is disposed radially on the outside of the first high-voltage insulator in the circumferential direction of the first high-voltage insulator.

The counter electrode may comprise: a first counter electrode having a cylindrical shape; and a second counter electrode having a funnel shape and detachably connected to the first counter electrode.

The rotating body may comprise: a rotor which is rotatably disposed on the outside of the plasma generating module; and a discharge head which is provided with the plasma nozzle, is detachably connected to an end of the rotor, and has a width gradually increasing to the end.

The rotor may comprise: a first rotor which is rotatably disposed radially on the outside of the first counter electrode with a bearing interposed therebetween; and a second rotor of which one end is detachably connected to the first rotor and the other end is detachably connected to the discharge head.

A lip seal having excellent slip properties to prevent damage to the bearing may be further provided on the periphery of the bearing.

The second rotor may comprise: a cylindrical enlarged-diameter connection section which is screw-connected to the first rotor; a first inclined section which is formed to be inclined at an end of the cylindrical enlarged-diameter connection section; a stepped section which forms a step height with the cylindrical enlarged-diameter connection section radially on the inside of the cylindrical enlarged-diameter connection section and has a diameter smaller than that of the cylindrical enlarged-diameter connection section; a second inclined section which is formed to be inclined at an end of the stepped section; and a cylindrical reduced-diameter connection section which is detachably connected to the discharge head at the end.

The inclination of the first inclined section may be greater than that of the second inclined section and a plurality of grooves may be formed on the outer wall of the cylindrical reduced-diameter connection section.

A bearing flange which is bent inward to prevent separation of the bearing may be formed on the end of the first rotor.

The plasma nozzle may comprise: a first inclined guide section which guides the plasma in an inclined direction in the discharge head; and a second inclined guide section which has an inclination different from that of the first inclined guide section and forms the plasma nozzle in combination with the first inclined guide section.

The plasma nozzle may further comprise an end dummy inclined guide section which is formed to be inclined at an angle different from that of any of the first and second inclined guide sections in the corresponding inclined guide sections so that the plasma can be guided to an inclined end surface of the discharge head or to a lower surface of the discharge head.

A plurality of plasma nozzles may be disposed on both the inclined end surface of the discharge head and the lower surface of the discharge head.

The plasma nozzles may be intensively disposed in the circumferential direction in some areas of both the inclined end surface of the discharge head and the lower surface of the discharge head.

The gas distribution hole may comprise: a reduced-diameter nozzle section whose diameter is gradually reduced toward the plasma nozzle; a cylindrical nozzle section which is connected to the reduced-diameter nozzle section in the area of a minimum diameter of the reduced-diameter nozzle section; and an enlarged-diameter nozzle section whose diameter is gradually enlarged from the cylindrical nozzle section to the plasma nozzle.

Advantageous Effects

According to the present invention, unlike the conventional devices, the plasma generating device of the present invention has a compact and improved structure, unlike the conventional devices, without requiring a complex structure such as a carbon brush, etc., which makes it possible to prevent the generation of dust and foreign material from the carbon brush, avoid frequent maintenance, and significantly improve the durability of the device, and thus can be widely applied to various industrial processes that require plasma.

DESCRIPTION OF DRAWINGS

FIG. 1 is a diagram showing the configuration of a plasma generating device in accordance with an embodiment of the present invention.

FIG. 2 is a cross-sectional structural view of FIG. 1.

FIG. 3 is a partial exploded view of FIG. 2.

FIG. 4 is a partial exploded view of a plasma generating module.

FIG. 5 is an enlarged view of a discharge head shown in FIG. 2.

FIG. 6 is a cross-sectional structural view of FIG. 1 from a different angle.

FIG. 7 is an enlarged view of a discharge head shown in FIG. 6.

FIG. 8 is a plan view of the discharge head.

FIG. 9 is a cross-sectional structural view of a plasma generating device in accordance with another embodiment of the present invention.

FIG. 10 is an enlarged view of a gas distribution hole shown in FIG. 9.

MODE FOR INVENTION

Hereinafter, embodiments of the present invention will be described in detail with reference to the accompanying drawings so that those skilled in the art may easily practice the present invention. However, the description of the present invention is provided only to illustrate the embodiments on structural or functional aspects, and thus the scope of the present invention should not be interpreted to be limited to the exemplary embodiments disclosed below.

That is, the exemplary embodiment may be changed in various ways and have various forms, and thus the scope of the present invention should be understood to include equivalents that can realize the technical spirit of the present invention. Moreover, the objects or effects disclosed in the present invention are not intended to be entirely or exclusively included in a specific embodiment, and thus the scope of the present invention should not be interpreted to be limited to the specific embodiment.

The meaning of the terms used herein should be understood as follows.

When a component is mentioned to be "connected" to another component, this may mean that it is directly connected to the other component, but it is to be understood that another component may exist in-between. On the other hand, when a component is mentioned to be "directly connected" to another component, it is to be understood that there are no other components in-between. Meanwhile, other expressions for describing the relationship between elements, i.e., "between" and "directly between," or "adjacent to" and "directly adjacent to" should be interpreted in a similar manner.

It is to be understood that an expression used in the singular encompasses the expression of the plural, unless it has a clearly different meaning in the context. Moreover, it is also to be understood that the terms such as "including" or "having", etc. are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Unless otherwise defined, all terms used herein, including technical or scientific terms, have the same meanings as those generally understood by those having ordinary skill in the art to which the present invention pertains. Such terms as those defined in a generally used dictionary are to be interpreted to have the meanings equal to the contextual meanings in the relevant field of art, and are not to be interpreted to have ideal or excessively formal meanings unless clearly defined in the present application.

Embodiments of the present invention will now be described below in detail with reference to the accompanying drawings, where the same components are used for the same components.

FIG. 1 is a diagram showing the configuration of a plasma generating device in accordance with an embodiment of the present invention, FIG. 2 is a cross-sectional structural view of FIG. 1, FIG. 3 is a partial exploded view of FIG. 2, FIG. 4 is a partial exploded view of a plasma generating module, FIG. 5 is an enlarged view of a discharge head shown in FIG. 2, FIG. 6 is a cross-sectional structural view of FIG. 1 from a different angle, FIG. 7 is an enlarged view of discharge head shown in FIG. 6, and FIG. 8 is a plan view of the discharge head.

Referring to these drawings, a plasma generating device 100 in accordance with the present embodiment has a compact and improved structure, unlike the conventional devices, without requiring a complex structure such as a carbon brush (not shown), etc., which makes it possible to prevent the generation of dust and foreign material from the carbon brush, prevent damage to a ground bearing, etc., and significantly improve the durability of the device, and thus can be widely applied to various industrial processes that require plasma. The plasma generating device 100 may comprise a plasma generating module 110 and a rotating body 170.

The plasma generating module 110 is an assembly in the form of a module that generates plasma.

Unlike the conventional ones, the plasma generating module 110 in accordance with the present embodiment generates plasma by itself The plasma generating module 110 may comprise a high-voltage electrode 120, counter electrodes 131 and 132, a gas inlet 140, high-voltage insulators 151 and 152, and a gas distributor 160.

The high-voltage electrode 120 is a rod-shaped electrode disposed in the central area.

When a high voltage is applied from the outside of the plasma generating module 110, the high voltage is applied to the high-voltage electrode 120 in the center through a cable C.

The counter electrodes 131 and 132 are disposed around the high-voltage electrode 120. The counter electrodes 131 and 132 and are charged with electric power to generate a high-voltage arc.

The counter electrodes 131 and 132 may be formed as a single body. However, in the present embodiment, the counter electrodes 131 and 132 are formed as separate bodies for the purpose of maintenance. That is, in the present embodiment, the counter electrodes 131 and 132 comprise a first counter electrode 131 having a cylindrical shape and a second counter electrode 132 having a funnel shape and detachably connected to the first counter electrode 131.

The gas inlet 140 is provided between the high-voltage electrode 120 and the counter electrodes 131 and 132 and is a portion through which compressed air or gas is injected into a discharge head 190.

The compressed air may be common compressed air, and the gas may be plasma gas.

The high-voltage insulators 151 and 152 are provided between the high-voltage electrode 120 and the counter electrodes 131 and 132 and provide insulation from the outside.

The high-voltage insulators 151 and 152 may also be formed as a single body. However, in the present embodiment, the high-voltage insulators 151 and 152 are formed as separate bodies for the purpose of maintenance.

That is, in the present embodiment, the high-voltage insulators 151 and 152 comprise a first high-voltage insulator 151 disposed adjacent to the gas inlet 140 and a second high-voltage insulator 152 disposed radially on the outside of the first high-voltage insulator 151 in the circumferential direction of the first high-voltage insulator 151.

The gas distributor 160 provides a space where the compressed air or gas injected through the gas inlet 140 is distributed.

To this end, the gas distributor 160 comprises a plurality of gas distribution holes 161. The plurality of gas distribution holes 161 may be arranged at equiangular intervals in the circumferential direction of the gas distributor 160.

Meanwhile, the rotating body 170 is provided with a plasma nozzle 191, through which the plasma generated by the plasma generating module 110 is blown to the outside, and is provided separately from the plasma generating module 110 to be rotatably disposed on the outside of the plasma generating module 110.

As the rotating body 170 on the outside of the plasma generating module 110 rotates while the plasma is generated by the plasma generating module 110, the plasma can be generated in a large area as shown in FIG. 1. For reference, the plasma can be injected vertically, unlike FIG. 1, and thus the scope of the present invention is not limited to the drawings.

The rotating body 170 comprises rotors 181 and 182 which are rotatably disposed on the outside of the plasma generating module 110 and a discharge head 190 which is provided with the plasma nozzle 191, is detachably connected to an end of the second rotor 182, and has a width gradually increasing to the end.

The rotors 181 and 182 may also be formed as a single body. However, in the present embodiment, the rotors 181 and 182 are formed as separate bodies for the purpose of maintenance That is, in the present embodiment, the rotors 181 and 182 may comprise a first rotor 181 which is rotatably disposed radially on the outside of the first counter electrode 131 with a bearing B interposed therebetween and a second rotor 182 of which one end is detachably connected to the first rotor 181 and the other end is detachably connected to the discharge head 190.

The first rotor 181 has a substantially cylindrical shape. A plurality of grooves 181*a* are formed on the outer wall of the first rotor 181, and a bearing flange 181*b* which is bent inward to prevent separation of the bearing B is formed on the end of the first rotor 181.

A lip seal 182*g* having excellent slip properties to prevent damage to the bearing B is further provided on the periphery of the bearing B inside the first rotor 181. The lip seal 182*g* may be made of polymers of fluorinated ethylene (PTFE), but the scope of the present invention is not limited to the material.

Meanwhile, as previously described, the plasma generating device 100 according to the present embodiment has a compact and improved structure, unlike the conventional devices, without requiring a complex structure such as a carbon brush, etc. used for ground, makes it possible to prevent the generation of dust and foreign material from the carbon brush and prevent the contamination of products during plasma surface treatment.

Moreover, with the use of the lip seal 182*g* having excellent slip properties, it is possible to prevent damage to the bearing B used for ground and significantly improve the sealing of the gas that generates plasma, thereby improving the durability of the device while maintaining the stability of plasma. Therefore, it is possible to avoid frequent maintenance and significantly improve the durability of the device, and thus the plasma generating device can be widely applied to various industrial processes that require plasma.

While the first rotor 181 has the substantially cylindrical shape, the second rotor 182 has the following structural characteristics.

That is, in the present embodiment, the second rotor 182 may comprise a cylindrical enlarged-diameter connection section 182*a* which is screw-connected to the first rotor 181, a first inclined section 182*b* which is formed to be inclined at an end of the cylindrical enlarged-diameter connection section 182*a*, a stepped section 182*c* which forms a step height with the cylindrical enlarged-diameter connection section 182*a* radially on the inside of the cylindrical enlarged-diameter connection section 182*a* and has a diameter smaller than that of the cylindrical enlarged-diameter connection section 182*a*, a second inclined section 182*d* which is formed to be inclined at an end of the stepped section 182*c*, and a cylindrical reduced-diameter connection section 182*e* which is detachably connected to the discharge head 190 at the end.

Given the fact that the second rotor 182 is disposed on the outside of the plasma generating module 110, the second rotor 182 can have the above structural characteristics. Here, the cylindrical enlarged-diameter connection section 182*a*, the first inclined section 182*b*, the stepped section 182*c*, the second inclined section 182*d*, and the cylindrical reduced-diameter connection section 182*e* may be integrally formed of a single material.

In the above structure of the second rotor 182, the inclination of the first inclined section 182*b* may be greater than that of the second inclined section 182*d*.

Moreover, a plurality of grooves 182*f* may be formed on the outer wall of the cylindrical reduced-diameter connection section 182*e*.

Meanwhile, the discharge head 190 is provided with the above-described plasma nozzle 191, is detachably connected to an end of the second rotor 182, and has a width gradually increasing to the end.

The plasma nozzle 191 comprises a first inclined guide section 191*a* which guides the plasma in an inclined direction in the discharge head 190 and a second inclined guide section 191*b* which has an inclination different from that of the first inclined guide section 191*a* and forms the plasma nozzle 191 in combination with the first inclined guide section 191*a*.

In the present embodiment, the plasma nozzle 191 further comprises a first or second end dummy inclined guide section 191*c* or 191*d* which is formed to be inclined at an angle different from that of any of the first and second inclined guide sections 191*a* and 191*b* in the corresponding inclined guide sections 191*a* or 191*b* so that the plasma can be guided to an inclined end surface 190*a* of the discharge head 190 or to a lower surface 190*b* of the discharge head 190.

That is, in the case of FIG. 5, the first end dummy inclined guide section 191*c* is provided on the first inclined guide section 191*a* so that the plasma can be guided to the inclined end surface 190*a* of the discharge head 190. Moreover, in the case of FIG. 7, the second end dummy inclined guide section 191*d* is provided on the second inclined guide section 191*b* so that the plasma can be guided to the lower surface 190*b* of the discharge head 190.

In this embodiment, a plurality of plasma nozzles 191 may be disposed on both the inclined end surface 190*a* of the discharge head 190 and the lower surface 190*b* of the discharge head 190. As shown in FIG. 8, the plasma nozzles 191 are intensively disposed in the circumferential direction in some areas of both the inclined end surface 190*a* of the discharge head 190 and the lower surface 190*b* of the discharge head 190. With these structural characteristics, the efficiency of plasma generation can be enhanced.

The operation of the plasma generating device 100 having the above configuration will be described as follows.

For example, it has been reported that when a polymer surface is exposed to an electric arc, the polymer surface is hydrophilized.

However, when the electric arc is directly applied to the polymer surface, the high voltage leaves a trace on the surface of the product. Therefore, in order to avoid this phenomenon, it is necessary to make the arc smooth and, in this embodiment, the high-voltage electrode 120 designed with a round shape is connected to a secondary coil of a high-voltage transformer for that purpose.

Meanwhile, the electric arc is generated between the high-voltage electrode 120 and the counter electrodes 131 and 132, and the air (or a specific gas) is in the plasma state by the arc generated. At this time, the plasma generated through the plasma nozzle 191 of the discharge head 190 can be blown to the outside by injecting the compressed air or gas, and the surface can be modified by the plasma.

For reference, higher voltage and more air increase the area of the arc generated, but much more air may reduce the treatment area, and thus appropriate conditions are required.

Continuous arc generates ions having high energy in the plasma field. When this energy by the ions is applied to the polymer surface, reactive active groups are formed on the surface. Therefore, it is the necessary condition for cross-linking between the polymer surface and ink, coating agents, adhesives, etc. The arc has a conical shape such as a flame coming from a torch as shown in FIG. 1.

As such, according to the present embodiment, the plasma generating device 100 has a compact and improved structure, unlike the conventional devices, without requiring a complex structure such as a carbon brush, etc., which makes it possible to prevent the generation of dust and foreign material from the carbon brush, prevent damage to the bearing B., avoid frequent maintenance, and significantly improve the durability of the device, and thus can be widely applied to various industrial processes that require plasma.

Moreover, the plasma generating device 100 of the present embodiment can provide strong high-voltage power, which ensure long-time reliability, can be operated structurally in a simple manner, and can be protected by its circuit.

FIG. 9 is a cross-sectional structural view of a plasma generating device in accordance with another embodiment of the present invention, and FIG. 10 is an enlarged view of a gas distribution hole shown in FIG. 9.

Referring to these drawings, a plasma generating device 200 of the present embodiment may also comprise a plasma generating module 210 and the rotating body 170.

The plasma generating module 210 may also comprise the high-voltage electrode 120, the counter electrodes 131 and 132, the gas inlet 140, the high-voltage insulators 151 and 152, and the gas distributor 160.

Here, the gas distribution hole 261 provided in the gas distributor 260 may have a structure different from the above-described gas distribution hole 161.

That is, in the present embodiment, the gas distribution hole 261 comprises a reduced-diameter nozzle section 261a whose diameter is gradually reduced toward the plasma nozzle 191, a cylindrical nozzle section 261b which is connected to the reduced-diameter nozzle section 261a in the area of a minimum diameter of the reduced-diameter nozzle section 261a, and an enlarged-diameter nozzle section 261c whose diameter is gradually enlarged from the cylindrical nozzle section 261b to the plasma nozzle 191.

The reduced-diameter nozzle section 261a prevents the generation of a vortex of gas flowing toward the reduced-diameter nozzle section 261a such that the gas flows uniformly and stably.

The cylindrical nozzle section 261b reduces the pressure of the gas introduced from the reduced-diameter nozzle section 261a to increase the flow rate. Moreover, the introduced gas can be injected from the enlarged-diameter nozzle section 261c at a desired flow rate by adjusting the thickness and length of the cylindrical nozzle section 261b.

The enlarged-diameter nozzle section 261c allows the gas to be more easily injected into the entire area of the discharge head 190.

In the case where the gas distribution hole 261 has a shape shown in FIG. 10, the flow rate of the gas passing through the reduced-diameter nozzle section 261a, the cylindrical nozzle section 261b, and the enlarged-diameter nozzle section 261c is increased and becomes uniform, which contributes to an increase in the efficiency of plasma generation.

Even with this structure, the plasma generating device 200 has a compact and improved structure, unlike the conventional devices, without requiring a complex structure such as a carbon brush, etc., which makes it possible to prevent damage to the bearing B, avoid frequent maintenance, and significantly improve the durability of the device, and thus can be widely applied to various industrial processes that require plasma.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

The invention claimed is:

1. A plasma generating device comprising:
  a plasma generating module which generates plasma; and
  a rotating body that comprises:
    at least one plasma nozzle through which the plasma generated by the plasma generating module is blown to the outside, wherein the rotating body is provided separately from the plasma generating module to be rotatably disposed on the outside of the plasma generating module; and
    a discharge head provided with the at least one plasma nozzle;
  wherein the plasma generating module comprises:
    a high-voltage electrode which is disposed in a central area;
    a counter electrode which is disposed around the high-voltage electrode, which during operation of the plasma generating device is charged with electric power applied to the high-voltage electrode to generate a high-voltage arc, wherein the counter electrode comprises:
      a first counter electrode having a cylindrical shape; and
      a second counter electrode having a funnel shape and being detachably connected to the first counter electrode; and
    a gas inlet which is provided between the high-voltage electrode and the counter electrode and through which compressed air or gas is injected into the discharge head.

2. The plasma generating device of claim 1, wherein the plasma generating module further comprises:
  at least one high-voltage insulator which is provided between the high-voltage electrode and the counter electrode; and
  a gas distributor which comprises a plurality of gas distribution holes through which the compressed air or gas is distributed.

3. The plasma generating device of claim 2, wherein the high-voltage insulator comprises:
  a first high-voltage insulator which is disposed adjacent to the gas inlet; and
  a second high-voltage insulator which is disposed radially on the outside of the first high-voltage insulator in the circumferential direction of the first high-voltage insulator.

4. The plasma generating device of claim 2, wherein each gas distribution hole comprises:
  a reduced-diameter nozzle section whose diameter is gradually reduced toward the plasma nozzle;
  a cylindrical nozzle section which is connected to the reduced-diameter nozzle section in the area of a minimum diameter of the reduced-diameter nozzle section; and
  an enlarged-diameter nozzle section whose diameter is gradually enlarged from the cylindrical nozzle section to the plasma nozzle.

5. The plasma generating device of claim 1, wherein the rotating body further comprises a rotor which is rotatably disposed on the outside of the plasma generating module, wherein the discharge head is detachably connected to an end of the rotor and has a width gradually increasing to the end.

6. The plasma generating device of claim 5, wherein the rotor comprises:
   a first rotor which is rotatably disposed radially on the outside of the first counter electrode with a bearing interposed therebetween; and
   a second rotor of which one end is detachably connected to the first rotor and the other end is detachably connected to the discharge head.

7. The plasma generating device of claim 6, wherein a lip seal having excellent slip properties to prevent damage to the bearing is further provided on the periphery of the bearing.

8. The plasma generating device of claim 6, wherein the second rotor comprises:
   a cylindrical enlarged-diameter connection section which is screw-connected to the first rotor;
   a first inclined section which is formed to be inclined at an end of the cylindrical enlarged-diameter connection section;
   a stepped section which forms a step height with the cylindrical enlarged-diameter connection section radially on the inside of the cylindrical enlarged-diameter connection section and has a diameter smaller than that of the cylindrical enlarged-diameter connection section;
   a second inclined section which is formed to be inclined at an end of the stepped section; and
   a cylindrical reduced-diameter connection section which is detachably connected to the discharge head.

9. The plasma generating device of claim 8, wherein the inclination of the first inclined section is greater than that of the second inclined section and a plurality of grooves are formed on the outer wall of the cylindrical reduced-diameter connection section.

10. The plasma generating device of claim 6, wherein a bearing flange which is bent inward to prevent separation of the bearing is formed on the end of the first rotor.

11. The plasma generating device of claim 5, wherein the plasma nozzle comprises:
   a first inclined guide section which guides the plasma in an inclined direction in the discharge head; and
   a second inclined guide section which has an inclination different from that of the first inclined guide section and forms the plasma nozzle in combination with the first inclined guide section.

12. The plasma generating device of claim 11, wherein the plasma nozzle further comprises an end dummy inclined guide section which is formed to be inclined at an angle different from that of any of the first and second inclined guide sections in the corresponding inclined guide sections so that the plasma can be guided to an inclined end surface of the discharge head or to a lower surface of the discharge head.

13. The plasma generating device of claim 12, wherein a plurality of plasma nozzles are disposed on both the inclined end surface of the discharge head and the lower surface of the discharge head.

14. The plasma generating device of claim 13, wherein the plasma nozzles are intensively disposed in the circumferential direction in some areas of both the inclined end surface of the discharge head and the lower surface of the discharge head.

* * * * *